(12) United States Patent
Guering et al.

(10) Patent No.: US 9,216,809 B2
(45) Date of Patent: Dec. 22, 2015

(54) VENTILATION SYSTEM, AIR BLOWING AND EXTRACTION CIRCUITS OF SUCH A SYSTEM, AS WELL AS AN AIRCRAFT AVIONICS BAY

(71) Applicant: Airbus Operations SAS, Toulouse (FR)

(72) Inventors: Bernard Guering, Montrabe (FR); Yves Durand, Aussonne (FR)

(73) Assignee: Airbus Operations SAS (FR)

( * ) Notice: Subject to any disclaimer, the term of this patent is extended or adjusted under 35 U.S.C. 154(b) by 409 days.

(21) Appl. No.: 13/628,153

(22) Filed: Sep. 27, 2012

(65) Prior Publication Data

US 2013/0082138 A1    Apr. 4, 2013

(30) Foreign Application Priority Data

Sep. 30, 2011 (FR) ...................... 11 58842

(51) Int. Cl.
| | | |
|---|---|---|
| *B64C 1/00* | (2006.01) | |
| *B64C 1/18* | (2006.01) | |
| *B64D 13/00* | (2006.01) | |
| *H05K 7/20* | (2006.01) | |
| *B64D 13/06* | (2006.01) | |

(52) U.S. Cl.
CPC . *B64C 1/18* (2013.01); *B64D 13/00* (2013.01); *H05K 7/20554* (2013.01); *B64D 2013/0614* (2013.01)

(58) Field of Classification Search
USPC .............................................. 244/117 R, 119
See application file for complete search history.

(56) References Cited

U.S. PATENT DOCUMENTS

| | | | | | |
|---|---|---|---|---|---|
| 4,518,196 | A | * | 5/1985 | Forster et al. ................. | 296/204 |
| 5,897,079 | A | * | 4/1999 | Specht et al. ............... | 244/118.5 |
| 6,027,072 | A | * | 2/2000 | Black et al. ................ | 244/118.5 |
| 6,491,254 | B1 | * | 12/2002 | Walkinshaw et al. ...... | 244/118.5 |
| 6,585,189 | B1 | * | 7/2003 | Smallhorn ................. | 244/118.5 |
| 7,920,382 | B2 | * | 4/2011 | Uluc et al. .................... | 361/696 |
| 8,262,023 | B2 | * | 9/2012 | Kofinger et al. .............. | 244/119 |
| 8,328,607 | B2 | * | 12/2012 | Reisbach ........................ | 454/76 |
| 8,393,573 | B2 | * | 3/2013 | Horstman et al. .......... | 244/118.5 |
| 8,602,088 | B2 | * | 12/2013 | Solntsev et al. ................. | 165/41 |
| 2001/0042612 | A1 | * | 11/2001 | Hasenoehrl et al. ......... | 165/80.3 |

FOREIGN PATENT DOCUMENTS

WO     02/16854 A1     2/2002

* cited by examiner

*Primary Examiner* — Brian M O'Hara
*Assistant Examiner* — Keith L Dixon
(74) *Attorney, Agent, or Firm* — Lerner, David, Littenberg, Krumholz & Mentlik, LLP

(57) ABSTRACT

A ventilation system for an avionics bay has two strut assemblies for stiffening the floor of the cockpit, each strut assembly being arranged symmetrically regarding to the central plane of the aircraft, and means of distribution of the blowing air in the cabinets of the bay from the strut assemblies. The extraction circuit includes exhaust ducts integrated in the cabinets and couples together by tight inter-cabinets junctions in an overall configuration of maximized compactness.

17 Claims, 4 Drawing Sheets

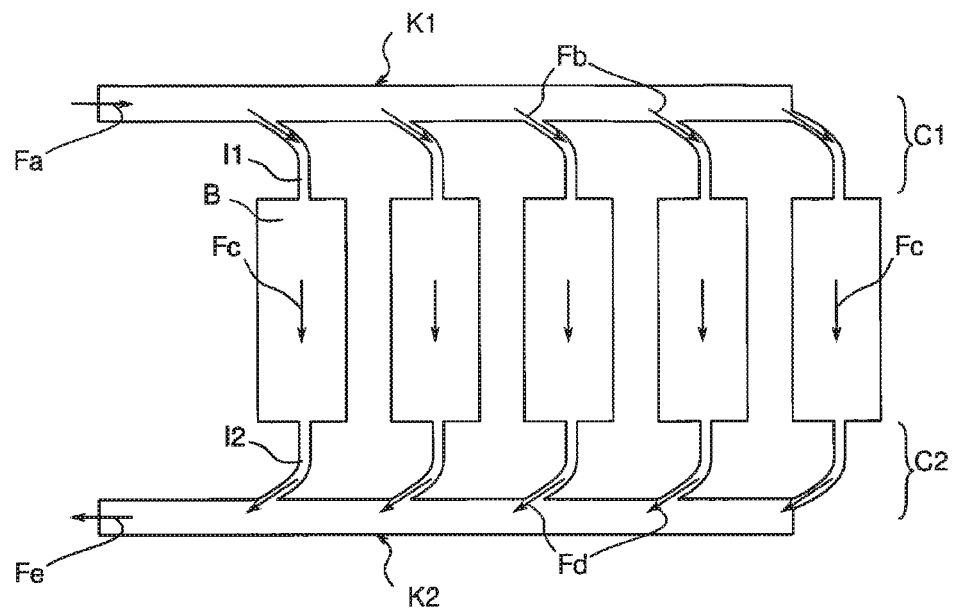
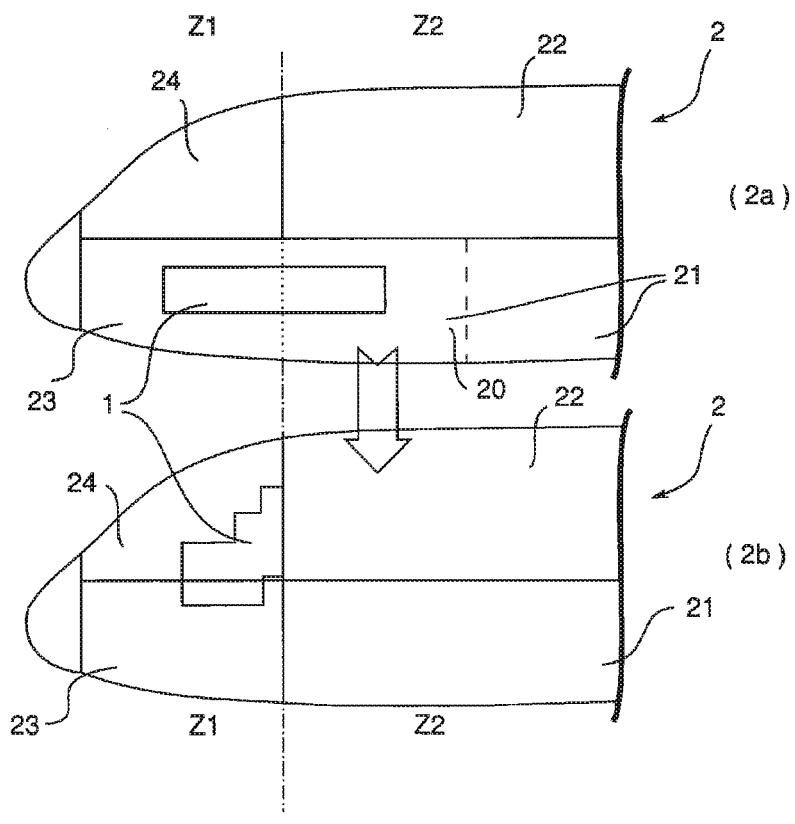
Figure 1
Figure 2

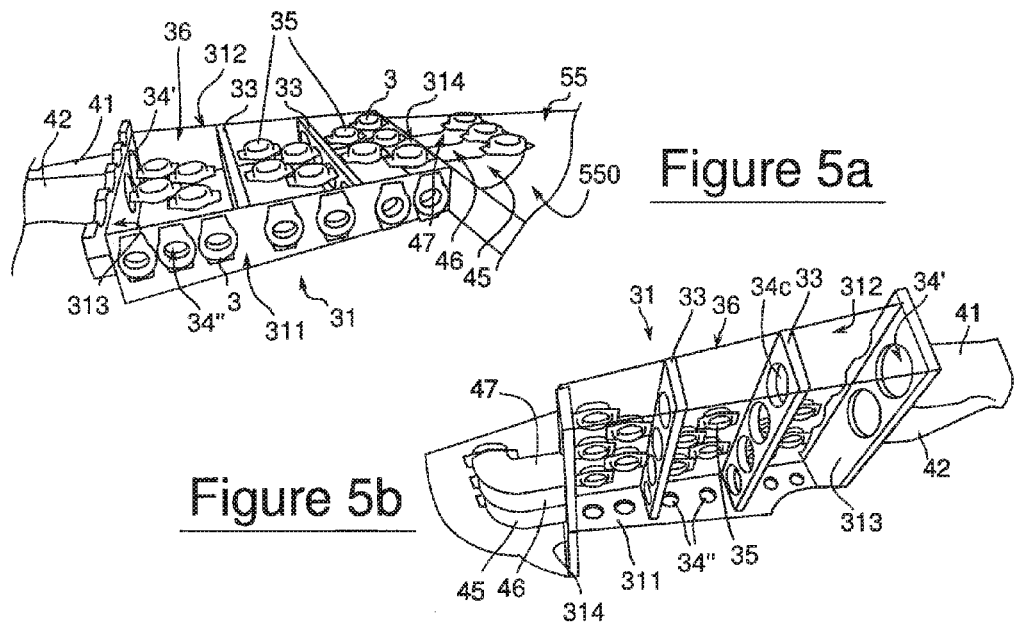
Figure 5a
Figure 5b
Figure 5c
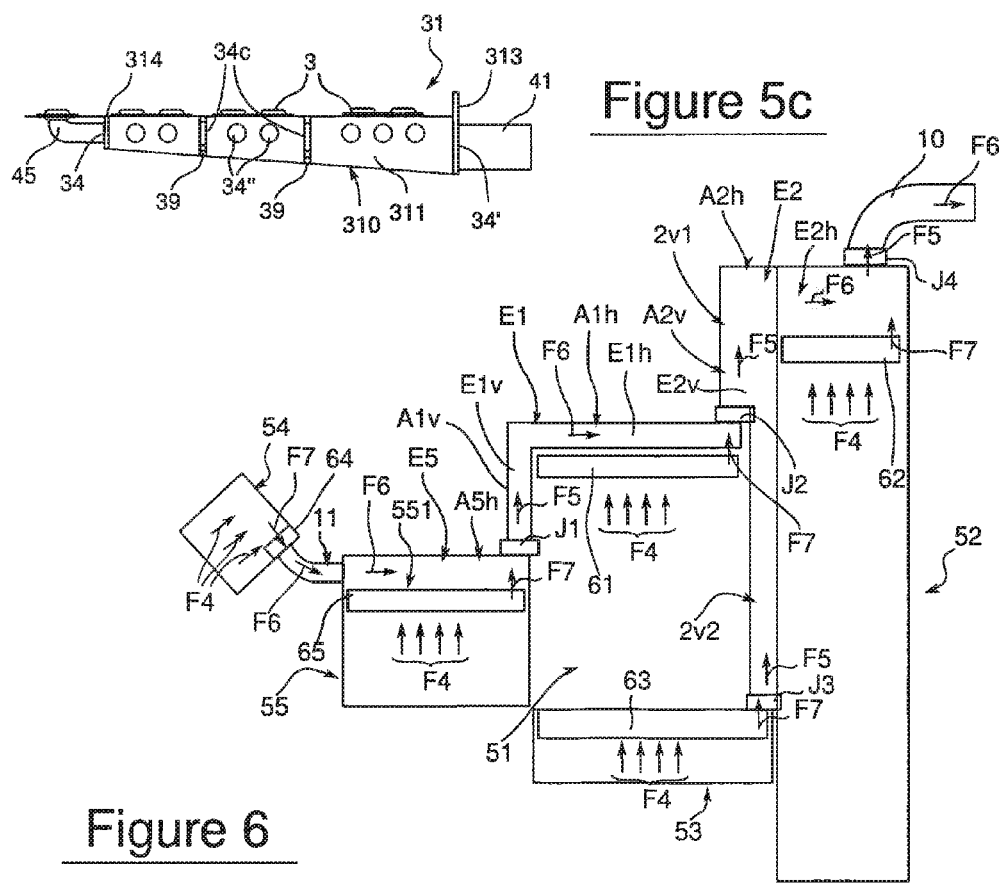
Figure 6

VENTILATION SYSTEM, AIR BLOWING AND EXTRACTION CIRCUITS OF SUCH A SYSTEM, AS WELL AS AN AIRCRAFT AVIONICS BAY

FIELD OF THE INVENTION

The present invention relates to ventilation systems of an avionics bay of an aircraft, in particular to the blowing and extraction air circuits for such system.

The invention generally applies to aircrafts provided with an avionics bay grouping together electric and electronic material as cabinets integrating electric cores, calculators and/or other electronic equipment (converters, etc.) and/or modules pertaining to the electric/electronic equipment, such as power modules, batteries, inertial units, etc. Electric harnesses being coupled to such bay allow this material to be connected to the functional or operational devices being concerned via the on-board network.

In operation, such material dissipates heat. The field of the invention relates to the continuous cooling of such material through transfer of the heat being dissipated. In the present disclosure, the expression "avionics bay" is not restrained to airplanes, but can apply to any type of aircraft or other transport means comprising a piloting cockpit.

BACKGROUND OF THE INVENTION

Up to now, the avionics bay is arranged in the bay located under the floor structure of the cockpit and in part in the cargo bay located under the passenger cabin. The expression "avionics bay" means in the present disclosure the whole electric and electronic cabinets above mentioned.

Now, because of the increase of the electric equipment, the cooling of the avionics bay is made, as schematically illustrated on FIG. 1, by a set of two independent circuits comprising: a blowing circuit C1 consisting in an air blowing inlet pipe K1 (arrow Fa) in each cabinet B by coupling with individual channels I1 (arrows Fb), the air then circulating in each cabinet (arrow Fc), and an extraction air C2 for the air having crossed the cabinet B, consisting in individual air extraction channels I2 (arrows Fd) coupled with an outlet extraction pipe K2 (arrow Fe). There are a blowing circuit C1 and an extraction circuit C2 for each of the sides of the airplane. Such circuits are duplicated for safety reasons.

Such circuits pose problems in terms of installation due to the complexity of their shape because of the small volume available. Moreover, in the cargo bay, the integration of the electric/electronic material is also problematic because this area is not secured. The separation to be observed between the redundant systems (cabinets, electric ways, air circuits, etc.) is restricting.

Thus, it has been proposed to integrate the whole avionics bay function into the secured area in front of the aircraft, comprising the cockpit, the front cargo bay and the floor structure between them.

However, the problem of the congestion is then posed abruptly, since such secured front area, in particular the cockpit, is already well filled with the whole equipment and apparatus thereof. The usual blowing and extraction means, consisting in tubes with a strong diameter being interconnected, are now made in a composite material of a weak thickness which can be "worked" for a better integration. Nevertheless, these means present installation constraints being difficult to manage due to the complexity and the volume thereof, as well as through their fragile construction in a light and thin material (in general a composite material).

BRIEF SUMMARY OF THE INVENTION

The embodiments of the present invention overcome at least some of the drawbacks linked to such installation constraints with a multifunctional approach for the operational components of the avionics bay and of the structural parts of a floor, substantially in their initial volume. Moreover, the embodiments of the present provide gains in terms of mass and cost by reducing the number of parts and making an integration of the system.

The embodiments of the present invention are applicable in particular to the floor structure of an aircraft cockpit, which is a privileged secured space, the structural volume of the floor then separating the cockpit from the front tip bay. The floor of other areas of the aircraft can also be used, in particular, the one of the dedicated passage areas (galley, toilets, etc.) forward, backward and sometimes in the central part of the passenger cabin.

More precisely, an aspect of the present invention provides a ventilation system for an electronic bay being integrated into an aircraft, comprising at least one cabinet, the system comprising a blowing circuit and an extraction circuit. In such a system, the blowing circuit comprises at least one strut assembly integrated into a floor intended for the aircraft and air distribution means between the cabinet(s) and the strut assembly or assemblies. And the extraction circuit comprises at least one air transmission conduct integrated into at least one cabinet.

According to a more particular ventilation system, the blowing circuit comprises said at least one strut assembly integrated into the floor intended for the aircraft and said air distribution means, and the extraction circuit comprises said at least one air transmission conduct.

The embodiments of the present invention also provide a blowing circuit for an avionics bay integrated into an aircraft and comprising at least one cabinet. Such above mentioned particular ventilation system circuit comprises at least one floor stiffening strut assembly. The circuit also comprises blowing air distribution means in said cabinet(s) of the bay from such strut assembly or assemblies.

According to advantageous features, the circuit comprises a double strut assembly, each strut assembly being symmetrically arranged with respect to each other according to a longitudinal plane of symmetry. Each strut assembly comprises traversal walls, an upper wall and a lower wall, at least one transversal wall possessing connecting means with fresh air transmission means. Furthermore, in at least one lateral wall, within its lid-forming upper wall and/or within its lower wall, each strut assembly can be provided with air distribution orifices being adapted to channel air blowing flows so as to ventilate the avionics cabinet being arranged the closest.

According to preferred embodiments:
- connection manifolds connect at least one orifice of each strut assembly to the fresh air transmission means;
- partitions being internal to each strut assembly formed in parallel to the connection side with the fresh air transmission means also have orifices aligned on those of the connection wall;
- the air distribution orifices are provided with adjustable diaphragms adapted to provide a sealing junction and a regulation of the blowing flows;
- the lower wall of each strut assembly is tilted so that the strut assembly presents an evolutive section to provide a drainage of the ventilation air condensation waters;

openings are arranged in the partitions of each strut assembly to provide the circulation of the drained water;

a sealing resin is deposited on each strut assembly so as to increase sealing.

According to an embodiment of the invention, an air extraction circuit of an avionics bay integrated into an aircraft, comprising at least one cabinet, may consist in the above mentioned blowing circuit. In such an air extraction circuit, the direction of the air flow is inverted so that such inverted air flows, the air distribution means and/or the air transmission means are dedicated to the extraction.

An embodiment of the invention also relates to an extraction circuit of an avionics bay integrated into an aircraft, comprising at least one cabinet, in particular an aircraft cockpit. Such particular ventilation system extraction circuit, as defined above, comprises transmission conducts integrated into the cabinets and dedicated to the inter-cabinets air transmission so as to provide an overall configuration of a maximized compactness.

According to some preferred embodiments:

sleeves combined with connection parts make the sealing junction of the extraction circuit;

the cabinets to be ventilated being formed by strut assemblies consisting in walls, air transmission parallelepiped conducts are formed on at least one substantially horizontal and/or vertical wall of the cabinets in order to at least partially meet such wall; these conducts provide extraction spaces integrated into the cabinets, wherein the air flows circulate after making a thermal exchange in the cabinet;

the cabinets constitute in the top part extraction collectors towards the air transmission conduct or a connection sleeve.

According to an embodiment of the invention, a blowing circuit of an avionics bay integrated into aircraft comprising at least one cabinet can also consist in the extraction circuit as mentioned above. In such blowing circuit wherein the direction of the air flows is inverted so that the air transmission conducts integrated into the cabinets, the air flows and/or the collectors are dedicated to blowing.

An embodiment of the invention also relates to a ventilation system of the type defined above with a blowing circuit consisting in the extraction circuit as defined above, wherein the direction of the airflows is inverted so that the air transmission conducts integrated into the cabinets, the air flows and/or the collectors are dedicated to blowing. In such a system, the extraction circuit consists in the circuit as defined above, wherein the direction of the airflows is also inverted so that such air flows, the air distribution means and/or the air transmission means are dedicated to the extraction.

An embodiment of the invention also relates to an avionics bay comprising cabinets and integrating an air transmission circuit which is adapted to serve as an extraction circuit and a blowing circuit for the above mentioned ventilation system. Such transmission circuit comprises air transmission conducts integrated into the cabinets and dedicated to the inter-cabinets air transmission so as to provide an overall configuration of a maximized compactness. The cabinets are then arranged the closest to each other so that the inter-cabinets conducts and sleeves present a minimal congestion.

BRIEF DESCRIPTION OF THE DRAWINGS

Other data, characteristics and advantages of the present invention will appear upon reading the non limitative description which follows referring to the accompanying figures, wherein, respectively:

FIG. 1 represents a ventilation schema for cabinets through a set of circuits and pipes according to the state of the art (already discussed);

FIG. 2 represents two principle schemas showing the position of the avionics bay before (schema 2a) and after (schema 2b) its integration into the secured area;

FIGS. 5a and 5c are perspective views (FIGS. 5a and 5b) and a sectional view (FIG. 5c) of an exemplary blowing strut assembly according to an embodiment of the invention; and FIG. 6 is a sectional schematic view of the cabinets in an avionics bay integrating extraction means according to an embodiment of the invention.

DETAILED DESCRIPTION

Figure 3:
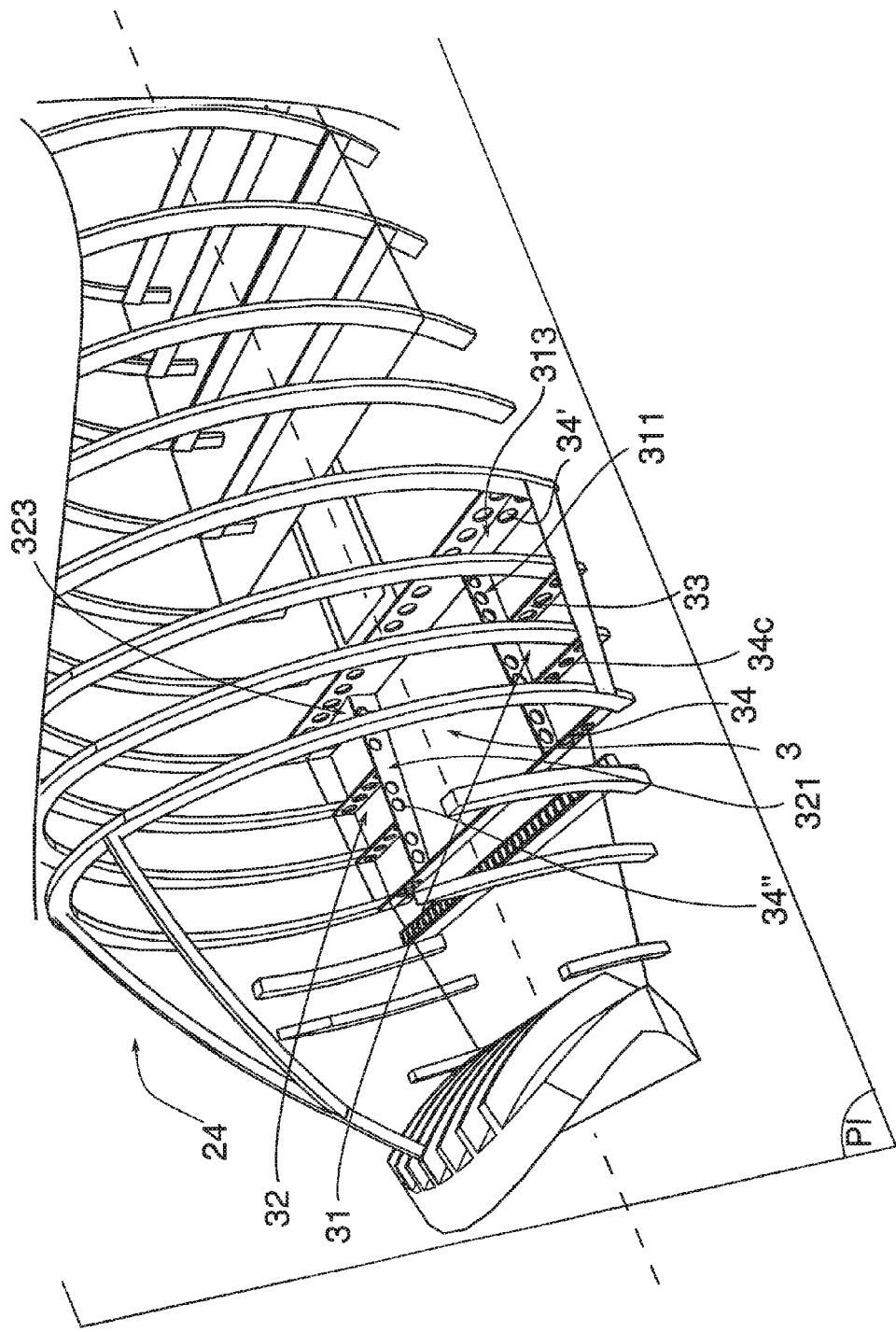
FIG. 3 is a simplified perspective view of an aircraft cockpit architecture integrating side blowing strut assemblies.

In the present description, the terms "forward", "backward", "front", "rear" "under", "upper", "lower", "lateral", "transversal", "internal", "external", "vertical", "horizontal", and the derivatives or equivalents thereof relate to relative positionings for elements in a standard configuration of an airplane lying on the ground and with respect to a longitudinal plane of symmetry being vertical in this configuration.

Referring to the principle schema of FIG. 2, the installation of the avionics bay 1 in an airplane 2 is conventionally distributed (schema 2a) between a part 20 of the cargo area 21—located under the passenger cabin 22 in a non secured area Z2—and the front bay 23 located under the cockpit 24 in a secured area Z1. According to an embodiment of the invention (schema 2b), the avionics bay 1 is partially displaced so as to come totally in the secured area Z1 forward of the airplane 2 through a distribution of the bay between the front bay 23 and the cockpit 24.

Preferably, the avionics bay is installed for most of it in the cockpit—for example over 80% and more—as illustrated below.

The simplified view of cockpit architecture 24 on FIG. 3 shows the lateral strut assemblies 31 and 32 through which the fresh air transits before blowing in the avionics bay. Such strut assemblies 31 and 32 are arranged symmetrically with respect to the longitudinal symmetry plane PI and let a central volume 3 being free to be able to accommodate a cabinet of the avionics bay (see detailed description above).

The strut assemblies 31 and 32 have transversal internal partitions 33. These partitions 33, the internal longitudinal walls 311 and 321, respectively, of the strut assemblies 31 and 32, as well as the rear transversal walls 313 and 323 of such strut assemblies, are perforated with respective orifices 34c, 34, 34' and 34" so as to provide an air blowing. These partitions 33 and the walls 311, 321, 313 and 323 are vertical.

Figure 4:
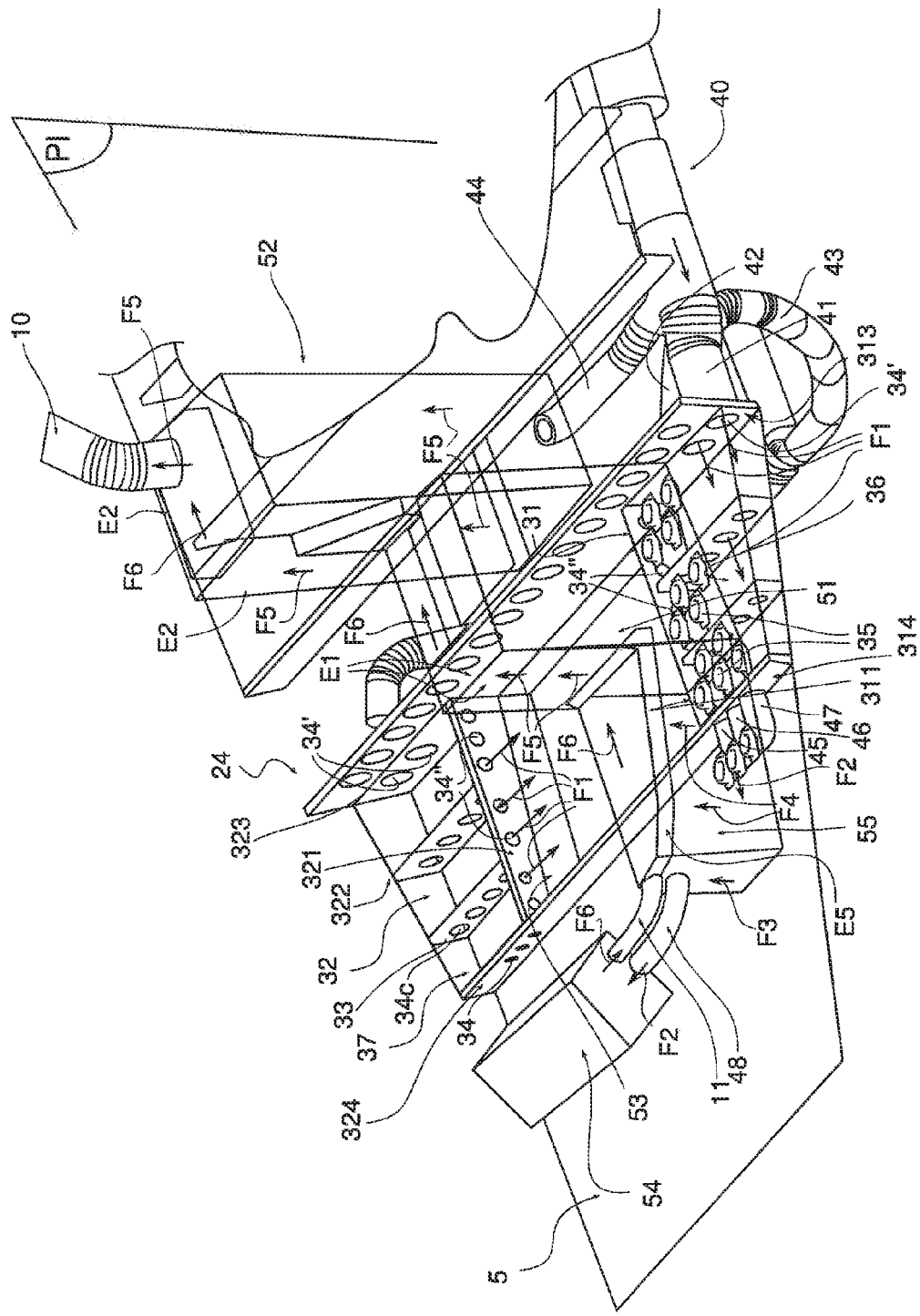
FIG. 4 is a perspective view of an avionics bay equipped with blowing and extraction means according to an embodiment of the invention.

Referring to FIG. 4, the blowing and extraction means of an avionics bay consisting in cabinets 51 to 55 (represented in transparency for a better visibility on the figure) are partially illustrated so as not to overload the figure. These cabinets are arranged in the cockpit 24 as compactly as possible so as to bring them closer at a maximum to define well integrated extraction conducts, with thus a compactness being maximized, and furthermore to gain space. Thus, in the illustrated example, the cabinets 55, 51 and 52 are arranged substantially juxtaposed from the less high to the higher from the front to the rear of the cockpit 24. The cabinet 54 is centrally offset in the cockpit and tilted on the floor 5 of the cockpit. The cabinet 53 is arranged in the central volume 3 made free in the walking floor 5 of the cockpit. Other equivalent cabinets, being not represented, can be arranged symmetrically with respect to the longitudinal plane PI.

The blowing fresh air comes from air distribution sealing manifolds 41 to 44 coming from the main tube 40. The manifolds 41 to 43 are connected to the air inlet orifices 34' in the strut assemblies 31 and 32. The air then crosses the cabinets 51 to 55, is submitted to thermal exchanges upon such crossings so as to extract the calories being present, and then is evacuated from the cabinets via an extraction tube 10.

As illustrated in reference to the strut assembly 31, the blown air (arrows F1) entering such strut assembly is redirected towards the cabinets 51 to 55 of the avionics bay, either directly—through the orifices 34" and 35 arranged respectively in the internal longitudinal walls 311, 321 and in horizontal lids 36 and 37 of the strut assemblies for the cabinets 53 and 51—, or through the orifices 34 of the front transversal walls 314, 324 of the strut assemblies, in connection with sleeves 45 to 48. The sleeves 45 to 47 connect the strut assembly 31 to the cabinet 55, and the sleeve 48 connects the cabinets 55 and 54 so as to provide air blowing in these cabinets (horizontal arrows F2 and vertical arrow F3). The external longitudinal walls 312 and 322 of the strut assemblies 31 and 32 consist in portions of the fuselage which thus closes the strut assemblies.

The strut assembly 31 is illustrated more precisely referring to FIGS. 5a to 5c by perspective views (being lateral on FIG. 5a and underside on FIG. 5b) and a section view (FIG. 5c).

On such FIGS. 5a to 5c are represented the fresh air distribution manifolds 41 and 42, the fresh air transfer sleeves 45 to 47, the horizontal air passage orifices 35 arranged in the lid 36 and the vertical ones 34, 34', 34", 34c respectively arranged in the front (314) and rear (313) transversal walls, in the internal longitudinal wall 311 and in the partitions 33. The air distributions orifices 34, 34', 34" and 35 are provided with adjustable sealing diaphragms 3 to allow the air flow to be regulated. The external longitudinal wall 312 has no air passage orifice.

The transfer sleeves 45 to 47 are also connected via adjustable diaphragms 3 to the orifices 35 arranged in the bottom wall 550 of the partially represented cabinet 55.

The section view according to FIG. 5c highlights the decreasing section of the strut assembly 31 in the longitudinal extension thereof. The bottom wall 310 of such strut assembly is tilted so that the transversal walls 313 and 314 present a height being just higher than the diameter of the orifices 34 and 34', the diameter of the orifices 34' being substantially higher than the one of the orifices 34.

Such tilted configuration of the strut assemblies allows the condensation waters from the ventilation air to be drained. Very fine openings 39 are made in the partitions to provide the circulation of the drain water. Moreover, the tilting of the strut assemblies is regulated to adjust their height as a function of the ventilation need.

Furthermore, the fresh air being blown in the cabinets 51 to 55 is extracted from these cabinets, as illustrated by the perspective view of FIG. 4 and the section view of FIG. 6. The extraction circuit consists in connection sleeves 11 between the cabinets, here between the cabinets 54 and 55, in adjacent air circulation conducts, here E1, E2, E5, integrated into the cabinets 51, 52 and 55 and in the final air extraction tube 10 outside the cockpit.

The adjacent circulation conducts E5, E1 and E2 each limit a parallelepiped extraction space by two parallel main walls, one of which consist in a wall forming at least in part a wall of the cabinet, here the cabinets 51, 52 and 55.

In particular, the extraction conduct E5 is restrained by a rectangle parallelepiped, the main wall A5h is parallel to the horizontal upper wall 551 of the cabinet 55. The extraction conducts E1 and E2 globally define two half-spaces being "perpendicular" between them E1v and E1h, E2v and E2h. The "perpendicular" half-spaces of each extraction space are perpendicular, since they are limited by perpendicular walls, respectively, A1v and A1h or A2v and A2h.

Moreover, each extraction space wall may consist in several parallel walls to accommodate the architecture of the cabinets: for example, the wall A2v consists in walls 2V1 and 2V2 so as to extract the air coming not only from the space E1, but also from the strut assembly 53.

Furthermore, inter-cabinets sealing junctions J1 to J3 and the connecting junction J4 between the extraction space E2 and the final extraction tube are arranged to connect the extraction conduct, respectively E5 and E1, E1 and E2 as well as E3 and E2, and form a continuous extraction circuit.

Because the hot air goes up, the successive positioning of the extraction spaces is horizontal and/or vertical ascending. The air extraction then occurs by following the vertical ascending path according to the arrows F4 in the cabinets 51 to 55 as well according to ascendant (arrows F5) and horizontal (arrows F6) vertical paths in the extraction spaces, namely: the horizontal extraction sleeve 11 of the cabinet 54, in the horizontal extraction conduct E5 of the cabinet 55, in the vertical extraction half-space E1v and the horizontal half-space A1h of the cabinet 51, as well as in the vertical half-space A2v and the horizontal half-space E2h of the cabinet 52.

The upper part of the cabinets 51 to 55 consists in hot air extraction collectors 61 to 65 (arrows F7) in connection with the adjacent extraction spaces: the connecting sleeve 11 for the cabinet 54, the space E5 for the cabinet 55, the half-space E2v for the cabinet 53 and the half-spaces E1h and E2h for the cabinets 51 and 52.

The invention is not limited to the exemplary embodiments being described and represented. Thus, the strut assemblies 31 and 32 can also serve as a walking floor 5 for the cockpit 24. Furthermore, these strut assemblies can also contribute for the most part to the cooling of other equipment and apparatus of the cockpit through openings arranged on their upper wall or on their lower wall for cooling the material located within the lower part (front or cargo bay).

Further, each cabinet can integrate more than two extraction spaces, for example on each external side (i.e. maximum six spaces for a parallelepiped cabinet). Moreover, the extraction spaces can be provided inside the cabinet (first category) or outside the initial cabinet (second category). In this last case, the final cabinet integrates the extraction spaces. In the above illustrated exemplary embodiment, the cabinet 55 belongs to the first category and the cabinets 51 and 52 to the second one.

Moreover, the blowing and extraction circuit and the means which constitute them can be inverted in their function by inverting the direction of the air flows: the blowing can be operated "from the top" from the extraction devise which then serves as a fresh air supplier and the extraction spaces become blowing spaces, whereas the extraction is made "from the bottom" and the evacuation of hot air is made by the air supplying manifolds.

The invention can apply to any transport structure: airplane, helicopter, locomotive, ship, etc. The term "avionics" is then to be adapted as a function of the structure (railway, naval, etc.).

The invention claimed is:

1. A ventilation system for an electronic bay being integrated into an aircraft, comprising at least one cabinet, the system comprising:
   a blowing circuit; and
   an extraction circuit;
   wherein one of the blowing and extraction circuits comprises:
      at least one strut assembly integrated into an aircraft floor, said at least one strut assembly comprising a first transversal wall, a second transversal wall, and a first longitudinal wall extending from the first transversal wall to the second transversal wall; and
      air distribution means, between the at least one cabinet and the at least one strut assembly, the air distribution means comprising at least one orifice defined within at least one of the first and second transversal walls, and the first longitudinal wall; and
      wherein the other of the blowing and extraction circuits comprises at least one air transmission conduct integrated into the at least one cabinet,
      wherein the blowing circuit comprises said at least one strut assembly integrated into the aircraft floor and said air distribution means, and
      wherein the extraction circuit comprises said at least one air transmission conduct.

2. The ventilation system according to claim 1, wherein the blowing circuit comprises at least one floor stiffening strut assembly and distribution means configured for blowing air in the at least one cabinet of the bay from the at least one strut assembly.

3. The ventilation system according to claim 2, wherein the blowing circuit comprises a double strut assembly, each strut assembly being symmetrically arranged with respect to each other according to a longitudinal plane of symmetry and comprising a first traversal wall, an upper wall and a lower wall, and
   wherein at least one of the first transversal walls comprises connecting means and fresh air transmission means.

4. The ventilation system according to claim 3, wherein each strut assembly comprises, on at least one first transversal wall and on a lid forming upper wall thereof, a first plurality of orifices configured to channel air blowing flows to ventilate the at least one cabinet.

5. The ventilation system according to claim 4, further comprising a connection manifold connecting at least one of the first plurality of orifices of each strut assembly to the corresponding fresh air transmission means.

6. The ventilation system according to claim 3, further comprising a plurality of partitions internal to each strut assembly, formed in parallel with the connection wall to the fresh air transmission means, and comprising a second plurality of orifices aligned with the first plurality of orifices of the first transversal wall.

7. The ventilation system according to claim 4, wherein the first plurality of air distribution orifices comprises a plurality of adjustable diaphragms adapted to make a sealing junction and a regulation of the air blowing flows.

8. The ventilation system according to claim 4, wherein the lower wall of each strut assembly is tilted for providing a drainage of the condensation water from the ventilation air.

9. The ventilation system according to claim 8, further comprising a third plurality of openings defined in the partitions of each strut assembly for providing a circulation of the drained water.

10. The ventilation system according to claim 4, further comprising a sealing resin deposited on the walls of each strut assembly for increasing sealing.

11. The ventilation system according to claim 4, wherein the extraction circuit comprises at least one of air distribution means and air transmission means configured for extraction.

12. The ventilation system according to claim 1, wherein the extraction circuit comprises at least one air transmission conduct integrated into the at least one cabinet and dedicated to the inter cabinet air transmission.

13. The ventilation system according to claim 12, further comprising a plurality of sealing junctions comprising a plurality of sleeves combined with connection parts.

14. The ventilation system according to claim 12, wherein, the at least one cabinet being formed by strut assemblies consisting in walls, the system comprising a plurality of air transmission parallelepiped conducts formed on at least one of a substantially horizontal and a vertical wall of the at least one cabinet to at least partially meet the corresponding wall, and to provide a plurality of extraction spaces integrated into the at least one cabinet,
   wherein the air flows circulate after making a thermal exchange in the at least one cabinet.

15. The ventilation system according to claim 12, wherein the at least one cabinet comprises in atop part thereof, at least one collector towards the air transmission conduct or a connection sleeve.

16. The ventilation system according to claim 14, wherein the blowing circuit comprising at least one air transmission conduct integrated into the at least one cabinet and at least one collector configured for blowing.

17. The ventilation system according to claim 1, wherein the blowing circuit comprises at least one air transmission conduct integrated into the at least one cabinet and at least one collector configured for blowing; and
   wherein the extraction circuit comprises at least one of air distribution means and air transmission means configured for extraction.

* * * * *